(12) United States Patent
Teh

(10) Patent No.: US 12,483,231 B2
(45) Date of Patent: Nov. 25, 2025

(54) POWER SOURCE CIRCUIT

(71) Applicants: Kabushiki Kaisha Toshiba, Tokyo (JP); Toshiba Electronic Devices & Storage Corporation, Tokyo (JP)

(72) Inventor: Chen Kong Teh, Ota Tokyo (JP)

(73) Assignees: Kabushiki Kaisha Toshiba, Kawasaki (JP); Toshiba Electronic Devices & Storage Corporation, Kawasaki (JP)

( * ) Notice: Subject to any disclaimer, the term of this patent is extended or adjusted under 35 U.S.C. 154(b) by 167 days.

(21) Appl. No.: 18/232,477

(22) Filed: Aug. 10, 2023

(65) Prior Publication Data

US 2024/0322810 A1    Sep. 26, 2024

(30) Foreign Application Priority Data

Mar. 22, 2023    (JP) .................................. 2023-045913

(51) Int. Cl.
| | |
|---|---|
| *H02H 9/00* | (2006.01) |
| *H03K 5/24* | (2006.01) |
| *H03K 17/06* | (2006.01) |
| *H03K 17/08* | (2006.01) |

(52) U.S. Cl.
CPC ............. *H03K 17/063* (2013.01); *H03K 5/24* (2013.01); *H03K 17/08* (2013.01)

(58) Field of Classification Search
None
See application file for complete search history.

(56) References Cited

U.S. PATENT DOCUMENTS

| | | | | |
|---|---|---|---|---|
| 6,356,121 | B1* | 3/2002 | Garnier | H03F 1/0244 |
| | | | | 327/66 |
| 6,366,485 | B1* | 4/2002 | Fujisawa | G04C 10/00 |
| | | | | 363/127 |
| 10,386,879 | B2* | 8/2019 | Yen | G05F 3/08 |
| 2008/0001606 | A1* | 1/2008 | Kojima | F02D 41/221 |
| | | | | 324/537 |
| 2019/0220048 | A1 | 7/2019 | Tomioka | |
| 2022/0091625 | A1* | 3/2022 | Luo | H02M 1/32 |

FOREIGN PATENT DOCUMENTS

| | | |
|---|---|---|
| JP | 4591110 B2 | 9/2010 |
| JP | 6993243 B2 | 12/2012 |
| JP | 2015050648 A | 3/2015 |

* cited by examiner

*Primary Examiner* — Stephen W Jackson
(74) *Attorney, Agent, or Firm* — Kim & Stewart LLP

(57) ABSTRACT

A power source circuit according to an embodiment includes: first and second transistors connected to a current path between an input terminal and an output terminal; a first node that supplies a first control voltage to a gate of the first transistor; a comparator with a first input terminal to which a voltage supplied to the input terminal is applied and a second input terminal to which a voltage appearing at a second node being a connecting point of respective drains of the first and second transistors is applied, the comparator being configured to compare voltages of the first input terminal and the second input terminal to each other and to control the first control voltage to be supplied to the first node based on a comparison result; and a diode connected between the first input terminal and the second input terminal of the comparator.

6 Claims, 6 Drawing Sheets

POWER SOURCE CIRCUIT

CROSS-REFERENCE TO RELATED APPLICATION

This application is based upon and claims the benefit of priority from the prior Japanese Patent Application No. 2023-045913 filed in Japan on Mar. 22, 2023; the entire contents of which are incorporated herein by reference.

FIELD

Embodiments described herein relate generally to a power source circuit.

BACKGROUND

In a power source circuit, in order to prevent internal circuitry from being destroyed when a power source and a ground are connected in reverse, a switch circuit is inserted in a power source line.

However, there is a problem that a reverse flow may occur when a voltage of an output terminal of the switch circuit becomes higher than an input terminal voltage during an on-operation of the switch circuit.

DETAILED DESCRIPTION

A power source circuit according to an embodiment includes: a first transistor a source of which is connected to an input terminal and a gate of which is supplied with a first control voltage from a first node; a second transistor a drain of which is connected to a drain of the first transistor, a source of which is connected to an output terminal, and a gate of which is supplied with a second control voltage; a comparator with a first input terminal to which a voltage supplied to the input terminal is applied and a second input terminal to which a voltage appearing at a second node being a connecting point of respective drains of the first and second transistors is applied, the comparator being configured to compare voltages of the first input terminal and the second input terminal to each other and to control the first control voltage to be supplied to the first node based on a comparison result; and a diode connected between the first input terminal and the second input terminal of the comparator.

Hereinafter, embodiments of the present invention will be described in detail with reference to the drawings.

First Embodiment

Figure 1:
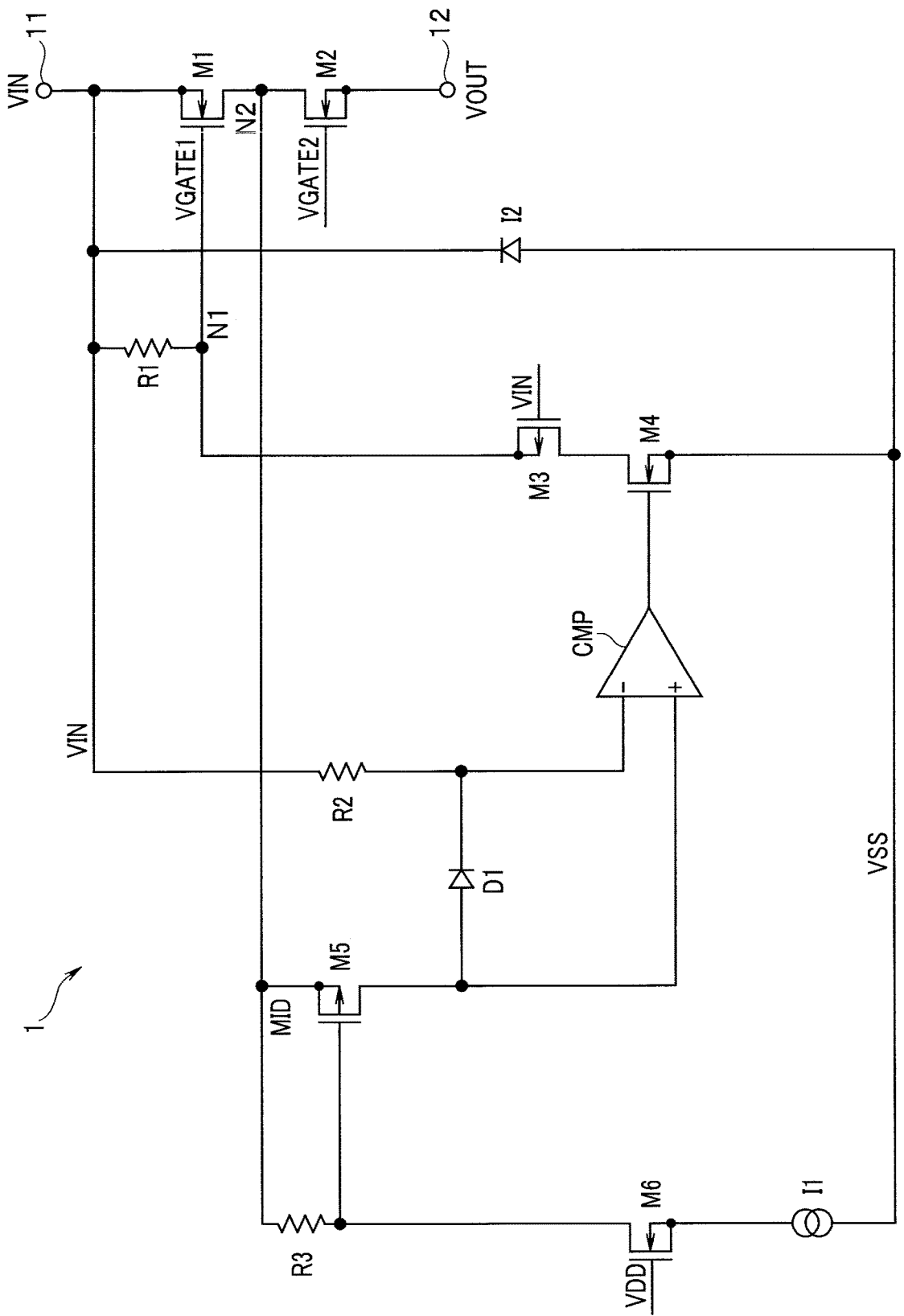
FIG. 1 is a circuit diagram showing a power source circuit according to a first embodiment of the present invention.

FIG. 1 is a circuit diagram showing a power source circuit according to a first embodiment of the present invention.

The present embodiment provides a protection circuit for preventing a reverse flow between input and output terminals of a switch circuit. Furthermore, in the present embodiment, the protection circuit can also be prevented from being destroyed when an input voltage becomes a negative voltage.

As shown in FIG. 1, a power source circuit 1 includes, between an input terminal 11 to which an input voltage VIN is supplied from outside and an output terminal 12 configured to output an output voltage VOUT to an external load circuit (not illustrated), NMOS transistors M1 and M2 that constitute a switch circuit. The switch circuit is constituted of the two transistors M1 and M2 in order to prevent a current from flowing when the transistors are off due to body diodes (parasitic diodes) of the transistors.

Furthermore, the power source circuit 1 includes PMOS transistors M3 and M5, NMOS transistors M4 and M6, resistors R1, R2, and R3, a diode D1, a comparator CMP, a current source I1, and an ESD (electro-static discharge) element I2.

Of the transistor M1, a source is connected to the input terminal 11 and a drain is connected to a drain of the transistor M2. Of the transistor M2, a source is connected to the output terminal 12 and a drain is connected to the drain of the transistor M1. A voltage VGATE1 that is a first control voltage and a voltage VGATE2 that is a second control voltage are respectively supplied to gates of the transistors M1 and M2 from a gate controller (not illustrated).

The gate controller is capable of applying a voltage for making the switch circuit conductive to the gates of the transistors M1 and M2 when outputting the voltage VOUT. In addition, the gate controller is capable of applying a voltage for making the switch circuit non-conductive to the gates of the transistors M1 and M2 when stopping the voltage VOUT. For example, when the voltage VIN is 80 V, the gate controller makes the switch circuit conductive by applying 85 V as the voltages VGATE1 and VGATE2 to the gates of the transistors M1 and M2. Furthermore, in order to make the switch circuit non-conductive, the gate controller may apply the voltage VGATE1 of 80 V to the gate of the transistor M1 and the voltage VGATE2 of 0 V to the gate of the transistor M2.

The resistor R1 is connected between the gate of the transistor M1 (hereinafter, referred to as a node N1) and the input terminal 11.

Current paths of the transistors M3 and M4 are connected in series between the node N1 and a reference potential point VSS. Of the transistor M3, a source is connected to the node N1, a drain is connected to a drain of the transistor M4, and a gate is supplied with the voltage VIN. In addition, of the transistor M4, a source is connected to the reference potential point VSS and a gate is supplied with an output of the comparator CMP.

A common drain of the transistors M1 and M2 (hereinafter, referred to as a node N2) is connected to a positive-polarity input terminal + of the comparator CMP via a current path of the transistor M5. Of the transistor M5, a source is connected to the node N2, a drain is connected to the positive-polarity input terminal + of the comparator CMP, and a gate is connected to the node N2 via the resistor R3.

A negative-polarity input terminal − of the comparator CMP is connected to the input terminal 11 via the resistor R2. An anode of the diode D1 is connected to the positive-polarity input terminal + of the comparator CMP and a cathode of the diode D1 is connected to the negative-polarity input terminal − of the comparator CMP. Note that a resistor may be connected between the positive-polarity input terminal + and the negative-polarity input terminal − of the comparator CMP instead of the diode D1.

The gate of the transistor M5 is connected to the reference potential point VSS via a current path of the transistor M6 and the current source I1. Of the transistor M6, a drain is connected to the gate of the transistor M5, a source is connected to the current source I1, and a gate is supplied with a power source voltage VDD.

The ESD element I2 that is an electrostatic protection element is connected between the input terminal 11 and the reference potential point VSS. The ESD element I2 has a function of protecting the element from a transient overvoltage due to static electricity.

Figure 2:
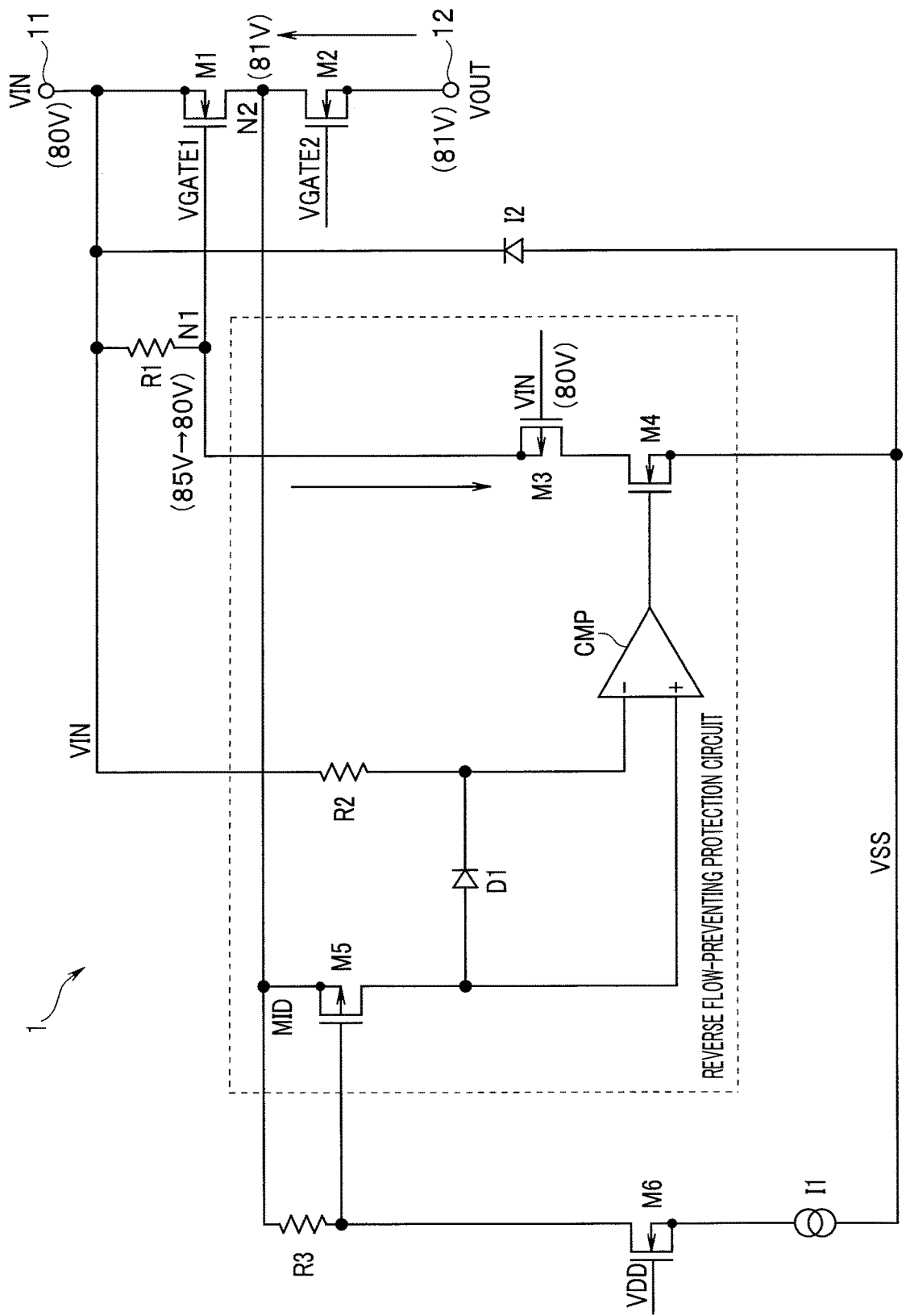
FIG. 2 is an explanatory diagram for describing a reverse flow-preventing operation.
Figure 3:
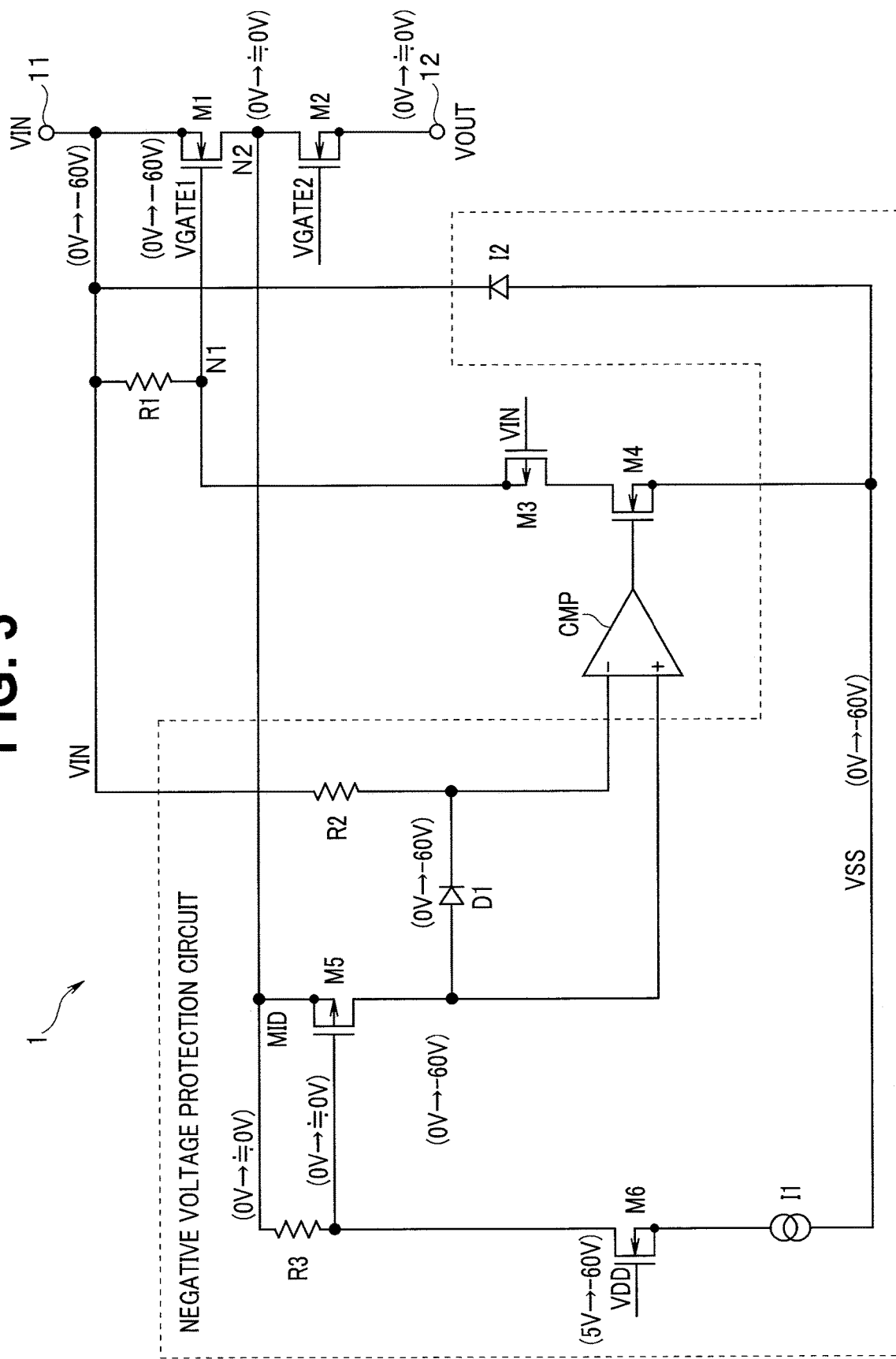
FIG. 3 is an explanatory diagram for describing protection against a negative voltage.

Next, operations of the embodiment configured as described above will be explained with reference to FIGS. 2 and 3. FIG. 2 is an explanatory diagram for describing a reverse flow-preventing operation, and FIG. 3 is an explanatory diagram for describing protection against a negative voltage. FIGS. 2 and 3 show examples of a voltage of each unit.

(Reverse Flow Prevention)

First, an operation of reverse flow prevention will be described with reference to FIG. 2. It is assumed that, presently, the voltage VIN is 80 V and the voltage VGATE1 and the voltage VGATE2 are set to 85 V by the gate controller. In this case, the transistors M1 and M2 are turned on and, during a normal operation, the voltage VIN of 80 V supplied to the input terminal 11 is supplied to a load from the output terminal 12 via the switch circuit constituted of the transistors M1 and M2.

Let us assume that, at this point, the voltage of the output terminal 12 rises to 81 V. As a result, since a channel of the transistors M1 and M2 is conductive, a reverse flow starts to occur from the output terminal 12 to the input terminal 11 as indicated by an arrow in FIG. 2. Accordingly, a voltage (hereinafter, referred to as a voltage MID) of the node N2 also rises to 81 V. In addition, during a normal operation in which a positive voltage is supplied to the input terminal 11, the voltage VDD (for example, 5 V) is applied to the gate of the transistor M6. Therefore, the transistor M6 is turned on and a current flows from the node N2 to the reference potential point VSS via the resistor R3. This current is a constant current (for example, 1 μA) generated by the current source I1. Since the source of the transistor M6 becomes lower than the voltage VDD (5 V), the transistor M6 has a function of preventing a withstand voltage violation of a transistor constituting the current source I1.

Due to the current flowing through the resistor R3, a gate voltage of the transistor M5 becomes lower than a source voltage and the transistor M5 is turned on. Accordingly, the voltage MID is applied to the positive-polarity input terminal of the comparator CMP via the transistor M5. On the other hand, the voltage VIN is applied to the negative-polarity input terminal − of the comparator CMP from the input terminal 11 via the resistor R2.

Since the voltage VIN is 80 V and the voltage MID is 81 V, the output of the comparator CMP is a high level (hereinafter, referred to as an H level). The H-level output of the comparator CMP is supplied to the gate of the transistor M4 and the transistor M4 is turned on. The voltage VIN is applied to the gate of the transistor M3 and the transistor M3 is turned on when the node N1 is at 85 V. Therefore, due to the transistor M4 being turned on, a current flows to the reference potential point VSS via the current paths of the transistors M3 and M4 as indicated by the arrow and causes the voltage of the node N1 to drop.

When the voltage of the node N1 drops to around 80 V, the transistor M3 is turned off to maintain the voltage of the node N1 at approximately 80 V. In other words, the voltage VGATE1 becomes 80 V and the transistor M1 is turned off. Switching the transistor M1 from on to off prevents the reverse flow from the output terminal 12 to the input terminal 11. Providing the transistor M3 can prevent the voltage of the node N1 from dropping too low and prevent the transistor M1 from being destroyed due to the application of an excessive voltage to the gate of the transistor M1.

In this manner, in the present embodiment, a reverse flow can be prevented from occurring from the output terminal 12 to the input terminal 11 by a reverse flow-preventing protection circuit enclosed by a dashed line.

However, a negative voltage may be applied to the input terminal 11 for some reason. In this case, a difference between the voltage MID applied to the positive-polarity input terminal + and the voltage VIN applied to the negative-polarity input terminal − of the comparator CMP increases, thereby creating a risk that the comparator CMP will be destroyed. In consideration thereof, the present embodiment includes a function of preventing the comparator CMP that constitutes the reverse flow-preventing protection circuit from being destroyed.

(Comparator Protection Circuit)

An operation of comparator protection will be described with reference to FIG. 3.

Let us assume that, presently, the voltage VIN is 0 V and the voltage VOUT and the voltage MID are 0 V. Let us also assume that, from this state, the voltage VIN of the input terminal 11 becomes a negative voltage such as −60 V. As a result, an inrush current starts to flow between the input terminal 11 and the output terminal 12. If the inrush current flows, there is a risk that the transistors M1 and M2 will be destroyed. In the present embodiment, the resistor R1 is provided between the input terminal 11 and the node N1. When the voltage VIN becomes −60 V, a current flows from the gate of the transistor M1 via the resistor R1 and the voltage VGATE1 also drops to approximately −60 V. Accordingly, the transistor M1 is turned off and the voltage VOUT and the voltage MID are maintained at approximately 0 V. In this manner, an inrush current between the input terminal 11 and the output terminal 12 can be prevented and the transistors M1 and M2 can be prevented from being destroyed.

In the description of reverse flow prevention provided above, the voltage of the node N2 and the voltage of the input terminal 11 are respectively applied to the positive-polarity input terminal + and the negative-polarity input terminal − of the comparator CMP. When the voltage of the input terminal 11 is a negative voltage, the node N2 and the output terminal 12 are at approximately 0 V since the transistor M1 is turned off and the voltage MID of 0 V and the voltage VIN of −60 V are supplied to the comparator CMP. When an input with a relatively large voltage difference is supplied to the comparator CMP in this manner, there is a risk that the comparator CMP will be destroyed. In consideration thereof, the present embodiment includes a negative voltage protection circuit enclosed by a dashed line.

The ESD element I2 is provided between the input terminal 11 and the reference potential point VSS and, when the voltage VIN changes from 0 V to −60 V, the reference potential point VSS also changes from 0 V to −60 V due to the ESD element I2. Accordingly, the gate voltage of the transistor M6 drops from 0 V to −60 V due to the effect of the reference potential point VSS and the transistor M6 is turned off. As a result, a current does not flow through the resistor R3. The gate voltage and the source voltage of the transistor M5 equally become approximately 0 V and the transistor M5 is turned off.

Accordingly, a current path between the positive-polarity input terminal + of the comparator CMP and the node N2 becomes non-conductive. The positive-polarity input terminal + and the negative-polarity input terminal − of the comparator CMP are connected to each other by the diode D1 and the positive-polarity input terminal + of the comparator CMP changes so as to match the voltage (−60 V) of the negative-polarity input terminal −. Therefore, an excessive input is prevented from being applied to the comparator CMP and the comparator CMP is prevented from being destroyed. As described above, in the present embodiment, by disconnecting the conduction between the node N2 and the positive-polarity input terminal + of the comparator CMP by the transistor M5 and using the diode D1 to match voltages of the positive-polarity input terminal + and the negative-polarity input terminal − of the comparator CMP during an abnormality in which a negative voltage is supplied to the input terminal 11, the comparator CMP can be prevented from being destroyed.

Second Embodiment

Figure 4:
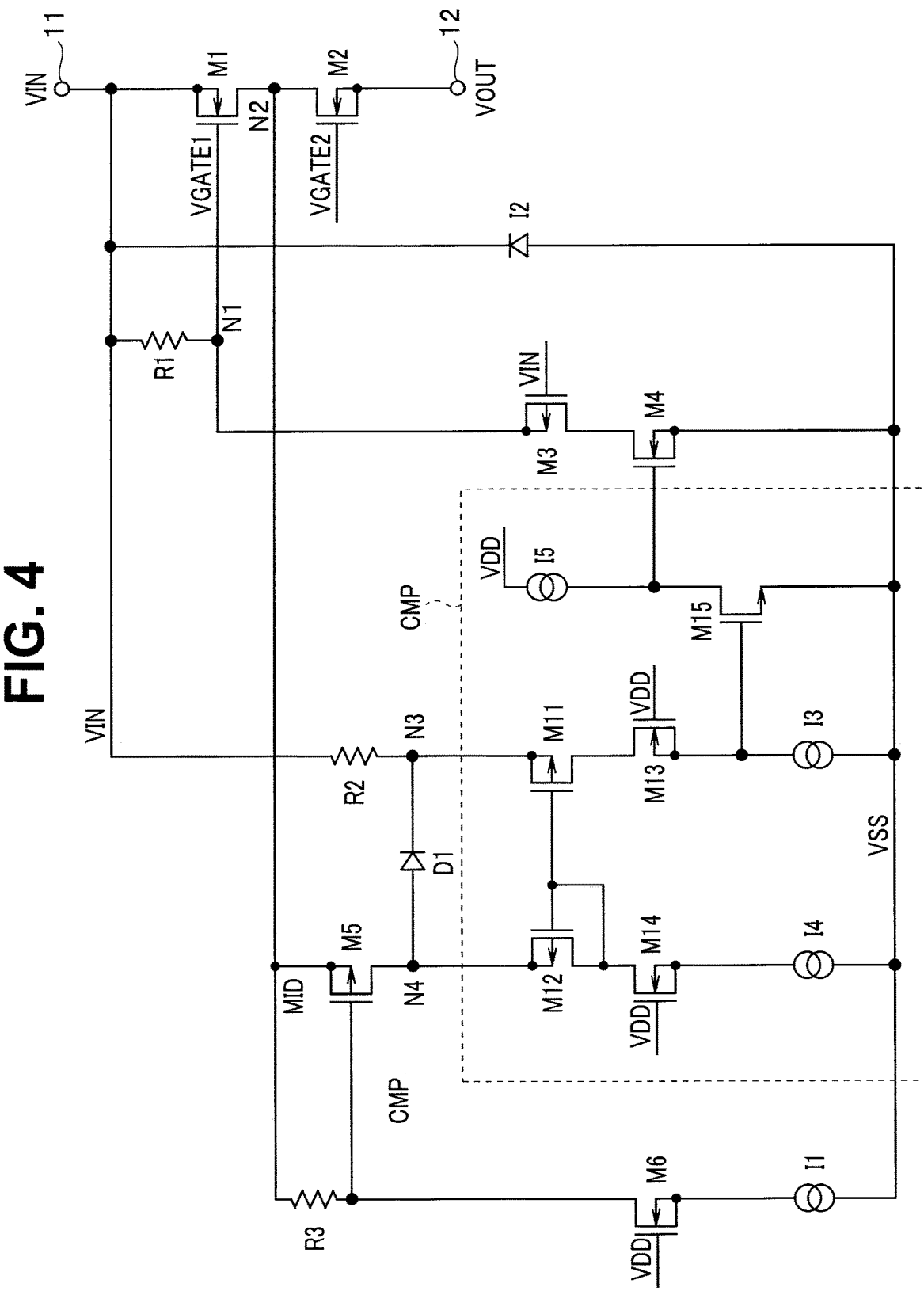
FIG. 4 is a circuit diagram showing a second embodiment of the present invention.

FIG. 4 is a circuit diagram showing a second embodiment of the present invention. In FIG. 4, same components as FIG. 1 will be denoted by same reference signs and a description of such components will be omitted. The present embodiment represents a specific configuration example of the comparator CMP.

In FIG. 4, the comparator CMP is constituted of PMOS transistors M11 and M12, NMOS transistors M13 to M15, and current sources I3 to I5. Note that the transistor M15 is a thin-film transistor. A connecting point of the resistor R2 and the cathode of the diode D1 (hereinafter, referred to as a node N3) is connected to the reference potential point VSS via a current path of the transistor M11, a current path of the transistor M13, and the current source I3. Of the transistor M11, a source is connected to the node N3, a drain is connected to a drain of the transistor M13, and a gate is connected to a gate of the transistor M12. Of the transistor M13, a source is connected to the current source I3 and a gate is supplied with the voltage VDD.

A connecting point of the drain of the transistor M5 and the anode of the diode D1 (hereinafter, referred to as a node N4) is connected to the reference potential point VSS via a current path of the transistor M12, a current path of the transistor M14, and the current source I4. Of the transistor M12, a source is connected to the node N4, the gate is connected to the gate of the transistor M11, and a drain is connected to a drain of the transistor M14 and the gate of the transistor M11. Of the transistor M14, a source is connected to the reference potential point VSS and a gate is supplied with the voltage VDD.

Current paths of the current source I5 and the transistor M15 are connected between a power source line that supplies the voltage VDD and the reference potential point VSS. Of the transistor M15, a drain is connected to the current source I5 and the gate of the transistor M4, a source is connected to the reference potential point VSS, and a gate is connected to the source of the transistor M13.

Note that the transistor M13 has a withstand voltage violation-preventing function similar to the transistor M6 or, in other words, a function of preventing a withstand voltage violation of a transistor constituting the current source I3. In a similar manner, the transistor M14 has a function of preventing a withstand voltage violation of a transistor constituting the current source I4.

Figure 5:
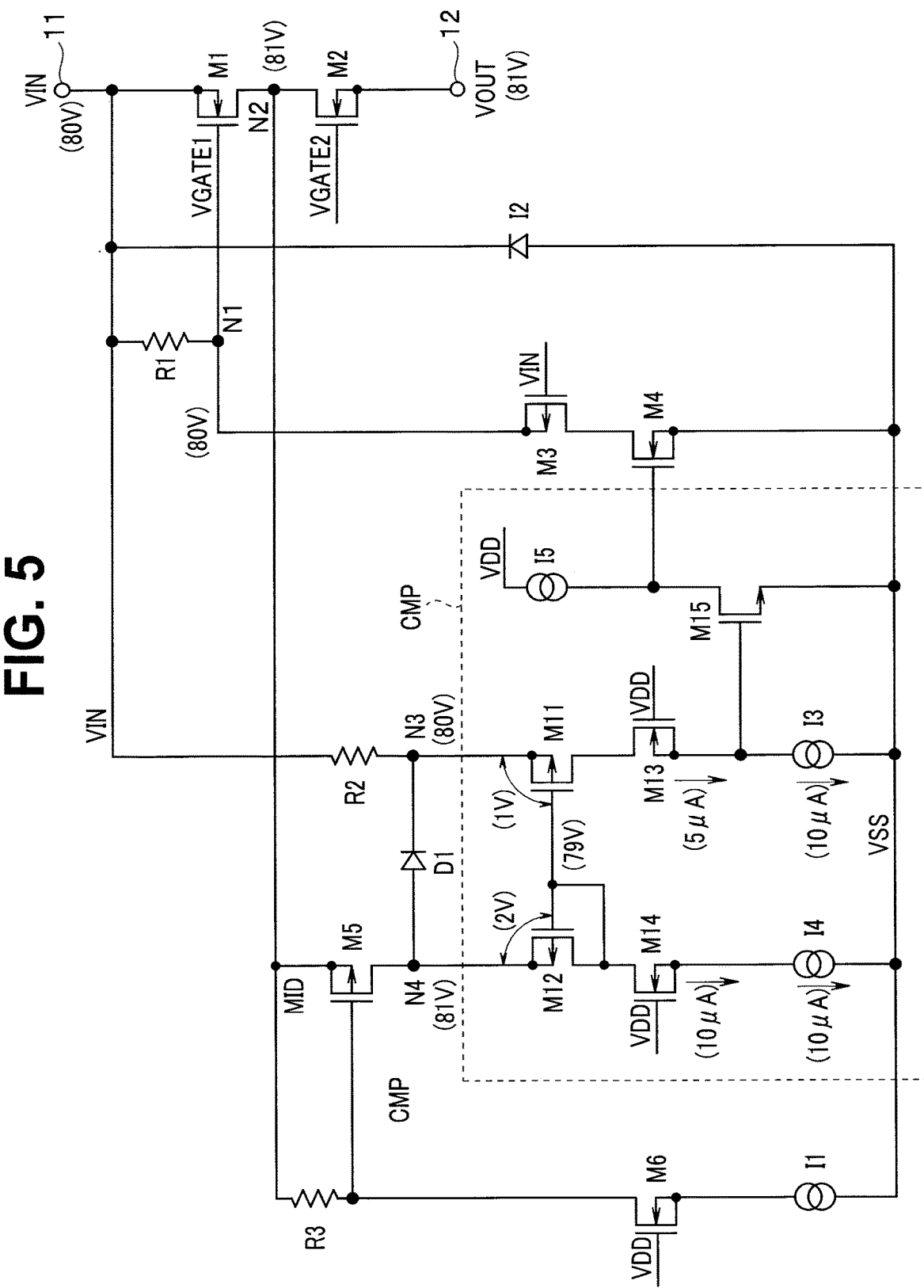
FIG. 5 is a circuit diagram for describing an operation of the second embodiment.

Next, operations of the embodiment configured as described above will be explained with reference to FIG. 5. FIG. 5 shows an example of a voltage of each unit in a case where a reverse flow is about to occur when the input terminal 11 is 80 V and the output terminal 12 becomes 81 V.

First, an operation of the comparator CMP during a normal operation or, in other words, when the input terminal 11 is 80 V and 80 V is supplied from the output terminal 12 to a load. 85 V is applied to the gates of the transistors M1 and M2 from the gate controller and the transistors M1 and M2 are turned on. In this case, a voltage of the node N2 is 80 V as described above. The transistor M5 is turned on and a voltage of the node N4 becomes 80 V. To be precise, the voltage of the node N4 is slightly lower than 80 V. On the other hand, a voltage of the node N3 is 80 V.

Gates of the transistors M11 and M12 are common and a gate-source voltage of the transistor M11 is higher than a gate-source voltage of the transistor M12. Therefore, a current that flows along the current path of the transistor M13 is larger than a current that flows along the current path of the transistor M14. Assuming that the currents of the current sources I3 and I4 are the same, a part of the current flowing from the source of the transistor M13 flows to the gate of the transistor M15 and the transistor M15 is turned on. The transistor M4 is turned off and the voltage VGATE1 of 85 V is applied to the gate of the transistor M1 from the gate controller and the transistor M1 remains turned on.

Next, let us assume that the voltage of the output terminal 12 changes to 81 V and a reverse flow starts to occur. The transistor M1 is turned on and the voltage of the node N2 changes from 80 V to 81 V. The transistor M5 is turned on and the voltage of the node N4 also becomes 81 V. On the other hand, the voltage of the node N3 is 80 V. Therefore, for example, assuming that a voltage of the common gate of the transistors M11 and M12 is 79 V, the gate-source voltage of the transistor M11 becomes 1 V and the gate-source voltage of the transistor M12 becomes 2 V. In other words, the gate-source voltage of the transistor M11 becomes lower than the gate-source voltage of the transistor M12 and the current that flows along the current path of the transistor M14 becomes larger than the current that flows along the current path of the transistor M13.

For example, assuming that currents of the current sources I3 and I4 are both 10 µA, the current that flows along the current path of the transistor M14 is 10 µA but the current that flows along the current path of the transistor M13 becomes a smaller current (for example, 5 µA) than 10 µA. As a result, a current flows from the gate of the transistor M15 to the reference potential point VSS and the transistor M15 is turned off. Accordingly, the gate of the transistor M4 changes to an H level and the transistor M4 is turned on. Accordingly, as described above, the node N1 drops to 80 V and the transistor M1 is turned off. In this manner, a reverse flow is prevented.

In this manner, according to the present embodiment, a similar effect to the first embodiment can be produced.

(Modifications)

Figure 6:
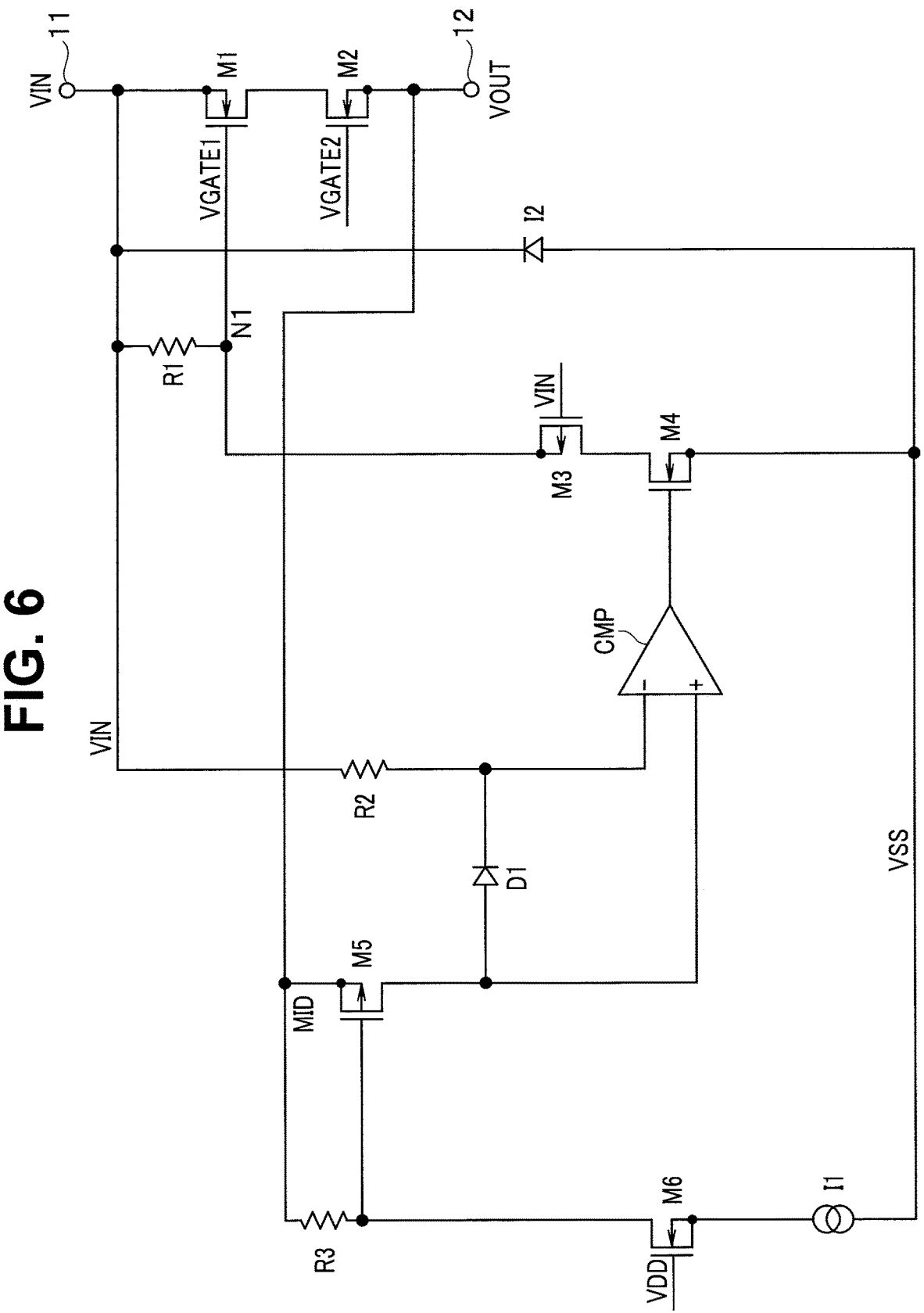
FIG. 6 is a circuit diagram showing a modification.

FIG. 6 is a circuit diagram showing a modification. In FIG. 6, same components as FIG. 1 will be denoted by same reference signs and a description of such components will be omitted.

The present modification differs from FIG. 1 in that the source of the transistor M5 is connected to the output terminal 12 and the voltage VOUT is supplied to the source of the transistor M5 instead of the voltage MID. The voltage VOUT and the voltage MID are approximately the same voltage and operations of the present modification are similar to FIG. 1. When a rise of the voltage VOUT is greater than a rise of the voltage VIN, since a voltage change of the voltage VOUT occurs slightly earlier than a voltage change of the voltage MID, the transistor M1 can conceivably be turned off slightly earlier than in the example shown in FIG. 1.

As described above, a similar effect to the first embodiment can also be produced in the present modification, and at the same time, reverse flow prevention can be performed at a higher speed.

While certain embodiments have been described, these embodiments have been presented by way of example only, and are not intended to limit the scope of the inventions. Indeed, the novel devices and methods described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:

1. A power source circuit, comprising:
   a first transistor a source of which is connected to a first input terminal, a drain of which is connected to a second node, and a gate of which is supplied with a first control voltage from a first node;
   a second transistor a drain of which is connected to the second node, a source of which is connected to a first output terminal, and a gate of which is supplied with a second control voltage;
   a comparator with a first input connected to a third node to which a voltage supplied to the first input terminal is applied and a second input connected to a fourth node to which a voltage supplied to the drain of the first transistor is applied, the comparator being configured to compare voltages of the third node and the fourth node to each other and to control the first control voltage to be supplied to the first node based on a comparison result; and
   a diode connected between the third node and the fourth node.

2. The power source circuit according to claim 1, further comprising:
   a third transistor configured to control conduction and non-conduction between the second node and the fourth node.

3. The power source circuit according to claim 2, further comprising:
   a fourth transistor a source of which is connected to the first node and a gate of which is supplied with a voltage that is supplied to the first input terminal; and
   a fifth transistor a drain of which is connected to a drain of the fourth transistor, a source of which is connected to a reference potential point, and a gate of which is supplied with an output of the comparator.

4. The power source circuit according to claim 3, further comprising:
   a resistor connected between the first input terminal and the first node;
   a sixth transistor a drain of which is connected to a gate of the third transistor, a source of which is connected to the reference potential point via a first current source, and a gate of which is supplied with a power source voltage;
   a resistor connected between the second node and the gate of the third transistor; and
   an electrostatic protection element connected between the first input terminal and the reference potential point.

5. The power source circuit according to claim 4, wherein the comparator includes:
   a seventh transistor a source of which is connected to the third node and a drain of which is connected to the reference potential point via a second current source;
   an eighth transistor a source of which is connected to the fourth node, a gate of which is connected to a gate of the seventh transistor, and a drain of which is connected to the reference potential point via a third current source and also to the gate of the seventh transistor; and
   a ninth transistor a drain of which is connected to a power source line configured to supply the power source voltage and to the gate of the fifth transistor, a source of which is connected to the reference potential point, and a gate of which is connected to the source of the seventh transistor.

6. The power source circuit according to claim 1, wherein the fourth node is supplied with a voltage appearing at the first output terminal instead of a voltage appearing at the second node.

* * * * *